United States Patent [19]

Buti et al.

[11] Patent Number: 5,318,663
[45] Date of Patent: Jun. 7, 1994

[54] METHOD FOR THINNING SOI FILMS HAVING IMPROVED THICKNESS UNIFORMITY

[75] Inventors: Taqi N. Buti, Millbrook; Joseph F. Shepard, Hopewell Junction, both of N.Y.

[73] Assignee: International Business Machines Corporation, Armonk, N.Y.

[21] Appl. No.: 996,209

[22] Filed: Dec. 23, 1992

[51] Int. Cl.$^5$ .......................................... H01L 21/302
[52] U.S. Cl. .................................. 156/636; 156/630; 156/649; 437/62; 437/68; 437/947; 437/981; 148/DIG. 168
[58] Field of Search ................... 437/68, 62, 947, 981; 156/630, 636, 649; 148/DIG. 160

[56] References Cited

U.S. PATENT DOCUMENTS

| | | | |
|---|---|---|---|
| 3,508,980 | 4/1970 | Jackson, Jr. et al. | 148/175 |
| 3,826,699 | 7/1974 | Sawazaki | 437/62 |
| 3,844,858 | 10/1974 | Bean | 156/636 |
| 3,911,562 | 10/1975 | Youmans | 29/590 |
| 3,969,168 | 7/1976 | Kuhn | 437/68 |
| 3,979,237 | 9/1976 | Morcom et al. | 156/3 |
| 4,233,091 | 11/1980 | Kawabe | 437/68 |
| 4,735,679 | 4/1988 | Lasky | 156/636 |
| 4,851,078 | 7/1989 | Short et al. | 156/632 |
| 4,971,925 | 11/1990 | Alexander et al. | 437/62 |
| 5,096,535 | 3/1992 | Hawkins et al. | 156/633 |
| 5,124,274 | 6/1992 | Ohki et al. | 437/62 |
| 5,262,346 | 11/1993 | Bindal et al. | 156/636 |

FOREIGN PATENT DOCUMENTS 4180648 6/1992 Japan ..................... 437/68

OTHER PUBLICATIONS

"A High Speed Vertical SOI FET Device" by W. H. Chang, Research Disclosure YO890-0266, May 1991, No. 325.

"Fabrication of CMOS on Ultrathin SOI Obtained by Epitaxial Lateral Overgrowth and Chemical-Mechanical Polishing" by G. Shahidi et al., 1990 IEEE, IEDM 90, pp. 587-590.

"Electrical Properties and Technological Perspectives of Thin-film SOI MOSFETs" by M. Yoshimi et al., IEICE Trans., vol. E74, No. 2, pp. 337-351, Feb. 1991.

Primary Examiner—Brian E. Hearn
Assistant Examiner—Laura M. Holtzman
Attorney, Agent, or Firm—Michael J. Balconi-Lamica

[57] ABSTRACT

A method of thinning SOI films for providing ultra-thin active device regions having excellent thickness uniformity and further having self-aligned isolation regions between the active device regions is disclosed. A substrate having an isolation layer formed thereon and further having a single crystal silicon layer formed upon the isolation layer is first provided. A thermal oxide layer is grown upon the silicon layer, patterned in desired regions corresponding to polish stop regions positioned between predetermined active device regions, and etched. The silicon layer is thereafter etched according to the patterned thermal oxide layer with a high selectivity etch, thereby creating grooves in the silicon layer. An insulative polish stop material is then deposited upon the thermal oxide, silicon, and isolation layers, the polish stop material forming top, sidewall, and bottom polish stop material thereon, respectively, partially filling the grooves, and further wherein the bottom polish stop material comprises a prescribed thickness. Polysilicon is deposited upon the polish stop material to further completely fill the grooves and then is planarized down to the top polish stop material. The top polish stop material and the oxide layer are then etched away. Lastly, by chemical-mechanical polishing, the silicon, sidewall polish stop material, and polysilicon are thinned down to the bottom polish stop material, whereby active device regions have uniform thickness corresponding to the thickness of the bottom polish stop material.

16 Claims, 2 Drawing Sheets

METHOD FOR THINNING SOI FILMS HAVING IMPROVED THICKNESS UNIFORMITY

BACKGROUND OF THE INVENTION

1. Field of the Invention

This invention generally relates to silicon-on-insulator films and, more particularly, to a method for thinning an SOI film having improved thickness uniformity.

2. Discussion of the Related Art

It has been demonstrated by 2D simulations and experiments that thinning SOI films to less than the maximum depletion depth in the channel region (that is, approximately 1000Å or less) brings about remarkable device properties as described in M. Yoshimi, et al., "Electrical Properties and Technological Perspectives of Thin-Film SOI MOSFETs", IEICE Trans., Vol. E74, No. 2, Feb. 1991, pp. 337-351. In ultra-thin SOI, the device body becomes fully depleted which results in greatly improved short channel characteristics at much lower channel dopings. This also increases the device turn-on voltage, i.e., threshold voltage ($V_T$), tolerance to body doping and channel length. In addition, full depletion produces near ideal subthreshold slope, nearly 45% improved transconductance and much higher current drivability. This in conjunction with reduced junction capacitances yields greater switching speed with thin SOI CMOS than in comparable bulk Si CMOS. These properties of ultra-thin SOI CMOS open superior possibilities for scaling CMOS structures in the deep sub-half μm regions that are impossible with conventional bulk silicon.

SOI films with thickness near 1000Å can be made using SIMOX (Separation by IMplantation of OXygen) technology. However, SIMOX/SOI wafers suffer from high defect density (>1000 per $cm^2$). Also, the cost of commercially available thin SIMOX/SOI is very high. On the other hand, wafer bonding and polishing produces defect-free SOI films at much lower cost. However, the minimum SOI thickness achievable with the present commercial wafer bonding technology is about 2 μm with thickness uniformity of about ±3000Å. Therefore, thinning the commercially available bonded SOI wafers to the thickness required for fully depleted CMOS (i.e., <1000Å) is an attractive approach for producing ultra-thin near-zero defect SOI material. A method for thinning SOI films having excellent thickness uniformity is highly desirable. Furthermore, a method for producing ultra-thin active device regions having self-aligned isolation regions is highly desirable.

SUMMARY OF THE INVENTION

An object of the present invention is to provide a method of thinning SOI films to produce ultra-thin SOI films having a high degree of thickness uniformity.

Another object of the present invention is to provide a method of thinning an SOI film to produce self-aligned isolation regions between active device regions of the thinned SOI film.

According to the present invention, a method of thinning SOI films for providing ultra-thin active device regions having excellent thickness uniformity and further having self-aligned isolation regions between the active device regions comprises the steps of:

a) providing a substrate having an isolation layer of a first thickness formed thereon and further having a single crystal silicon layer of a second thickness formed upon the isolation layer;

b) growing a thermal oxide layer of a third thickness upon the silicon layer, patterning the thermal oxide layer in desired regions corresponding to polish stop regions between predetermined active device regions, and etching the patterned thermal oxide layer in the desired regions;

c) etching the silicon layer according to the patterned thermal oxide layer with a high selectivity $Si:SiO_2$ etch, whereby grooves are created in the silicon layer in the desired regions;

d) depositing a layer of insulative polish stop material upon exposed surfaces of the thermal oxide, silicon, and isolation layers, the layer of polish stop material forming top, sidewall, and bottom polish stop material thereon, respectively, and further wherein the bottom polish stop material is of a prescribed thickness;

e) depositing polysilicon upon the layer of polish stop material to completely fill the grooves;

f) planarizing said polysilicon layer down to the top polish stop material;

g) etching the top polish stop material and the oxide layer using RIE; and h) chemically-mechanically polishing the silicon, sidewall polish stop material, and polysilicon down to the bottom polish stop material, whereby the bottom polish stop material serves as a visual polishing stop indicator and a self-aligned isolation region to adjacent active device regions, the active device regions having uniform thickness corresponding to the thickness of the bottom polish stop material.

BRIEF DESCRIPTION OF THE DRAWINGS

The foregoing and other teachings of the present invention will become more apparent upon a detailed description of the best mode for carrying out the invention as rendered below. In the description to follow, reference will be made to the accompanying drawings, in which.

DETAILED DESCRIPTION OF THE PREFERRED EMBODIMENTS

The preferred embodiment of the present invention is best understood by referring to FIGS. 1-9 of the drawings, like numerals being used for like and corresponding parts of the various drawings.

Figure 1:
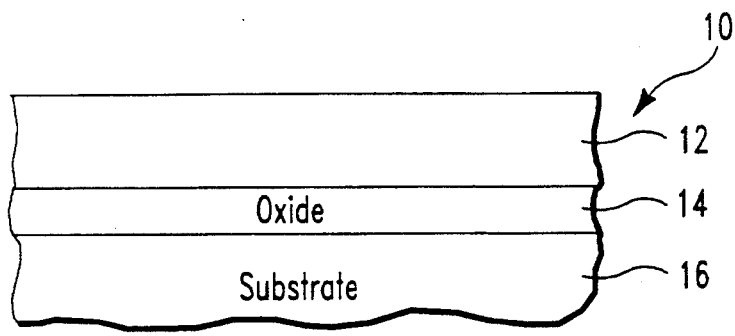
FIGS. 1-9 show an SOI film being thinned at various stages according to the present invention.

Referring now to FIG. 1, a silicon-on-insulator (SOI) wafer 10, such as a wafer bonded SOI wafer commercially available from Shin-Etsu Handotai (S.E.H.) of Tokyo, Japan, comprises a silicon layer 12, a buried insulation layer 14, and a substrate 16. Silicon layer 12 comprises a layer having an initial film thickness of about 1-2 μm with a thickness uniformity of approximately ±3000Å. Silicon layer 12 further comprises a single crystal high quality SOI film, preferably (100) oriented. Buried insulation layer 14 comprises an oxide layer having a thickness of 5000Å or less.

Figure 2:
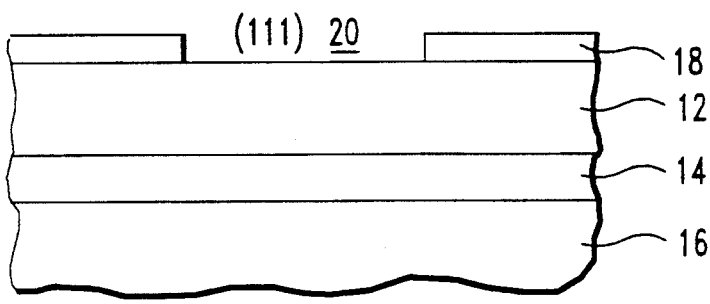

An oxide layer 18 is grown upon SOI film 12 as shown in FIG. 2. Oxide layer 18 can comprise, for example, a thermal oxide having a thickness of approximately 1500Å. Oxide layer 18 is patterned according to a prescribed pattern and subsequently etched by any well-known patterning and etching technique known in the art. The prescribed pattern can be that of desired isolation regions between active device regions to be subsequently formed in the SOI film 12 and may also include separate indicators or polish stop regions, located in kerf areas of the SOI film, for ease of chemical-mechanical polishing control. For example, patterned area 20 of oxide layer 18 corresponds to a desired isolation region yet to be formed. It will be understood that more than one patterned area 20 is possible in oxide layer 18.

Figure 3:
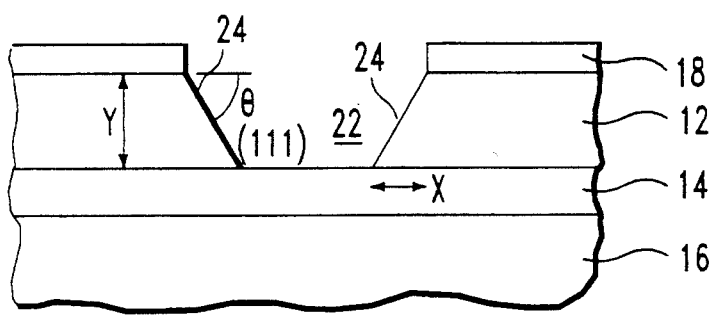

Subsequent to the patterning and etching of oxide layer 18, the SOI layer 12 is etched using a high selectivity (Si:SiO$_2$) etch and the exposed SiO$_2$ layer 14 is not significantly etched. For example, with a high selectivity Si:SiO$_2$ orientation dependent etch, wherein the etch rate is approximately 100 times faster along (100) planes than along (111) planes, a precise V-shaped groove 22 in the silicon layer 12 is created. Such etching of the SOI layer 12 can be accomplished by dipping wafer 10 in a solution of potassium hydroxide (KOH) for a prescribed period of time depending upon the initial thickness of silicon layer 12. For example, for a silicon layer 12 initial thickness of 2 $\mu$m, an etching time of approximately 30 seconds is required. The resulting sidewall edges 24 of the groove 22 are in the (111) planes and at a prescribed angle $\theta$ from the (100) surface. More particularly, the sidewall edges 24 are in the (111) planes at an angle of 54.7° from the (100) surface. As shown in FIG. 3, $x = y \cdot \tan(35.3)$ which is approximately equal to $\frac{1}{2}y$. It should be noted that other high selectivity wet etches, such as, ethylenediamine-pyrocatechol-water mixes and various mixtures of HNO$_3$—HF—H$_2$O (an isotropic etch) can also be used. Furthermore, high selectivity dry etches, for example, CF$_4$—O$_2$ mixes, could also be used.

Figure 4:
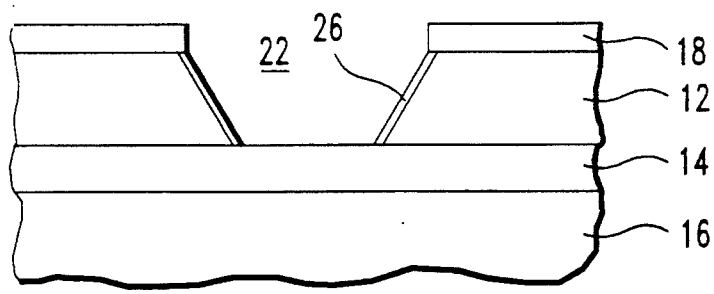

Referring now to FIG. 4, an optional thin buffer oxide 26 having a thickness of approximately 100Å is grown upon sidewall edges 24. Buffer oxide 26 provides stress relief between a subsequently formed silicon nitride layer and the silicon. Such a buffer oxide 26 can be grown in dry oxygen at 800–900° C., for example.

Figure 5:
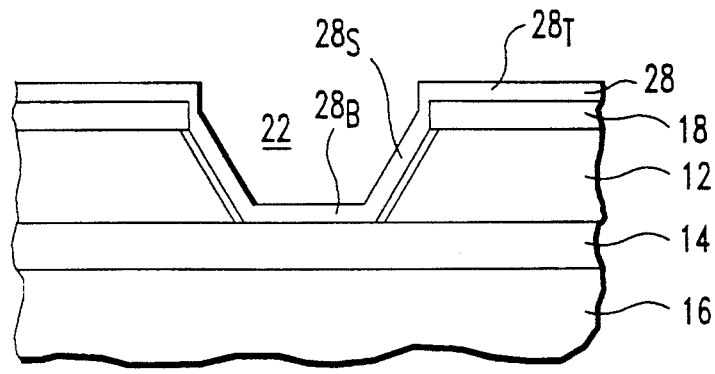

A layer of insulative polish stop material 28 is subsequently deposited upon wafer 10 to form top polish stop material 28$_T$, sidewall polish stop material 28$_S$, and bottom polish stop material 28$_B$, as shown in FIG. 5. Top and bottom polish stop material are of approximately the same thickness, wherein the thickness of the bottom polish stop material 28$_B$ is a prescribed thickness corresponding to a desired thickness of the yet to be formed resultant thinned silicon layer or active device regions. The prescribed thickness of bottom polish stop material 28$_B$ is preferably less than 1000Å with a thickness uniformity tolerance of ±100Å or better. Polish stop material 28 preferably comprises chemical vapor deposited (CVD) nitride. Polish stop material 28 can alternatively comprise CVD SiO$_2$ deposited from tetraethylorthosilicate (TEOS), for example, or any other suitable polish stop material.

Figure 6:
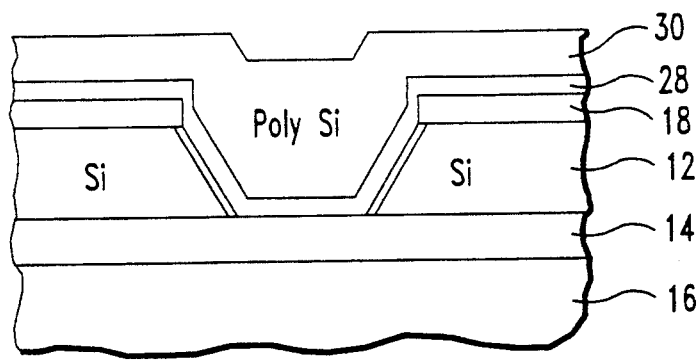

Referring now to FIG. 6, a layer 30 of polysilicon is deposited upon polish stop material 28, completely filling in V-groove 22. Layer 30 preferably comprises CVD polysilicon.

Figure 7:
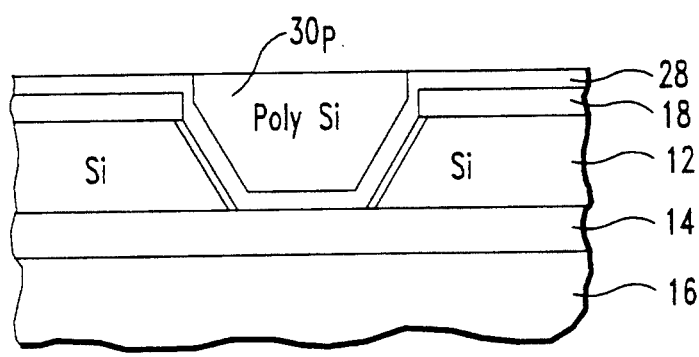

Layer 30 is subsequently planarized, using the top polish stop material 28$_T$ as a polish stop. This results in the planar topography as shown in FIG. 7, with the polysilicon 30$_P$ remaining.

Figure 8:
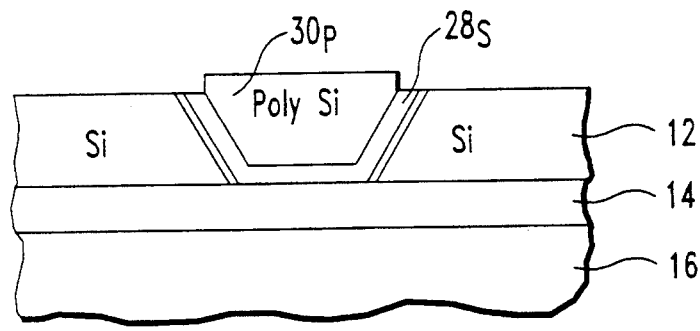

Top polish stop material 28$_T$ and oxide layer 18 are then completely removed, for example, by reactive ion etching (RIE) as shown in FIG. 8. RIE is well-known in the art and therefore not discussed herein.

Figure 9:
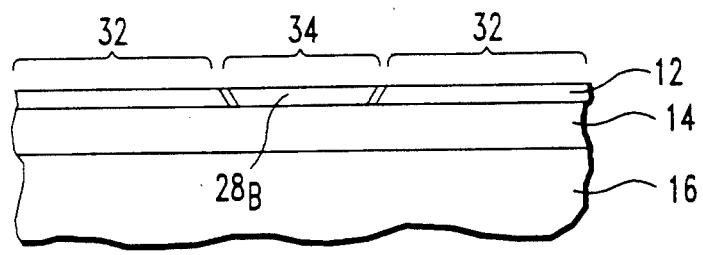

The SOI film 12 is now ready for thinning, using the bottom polish stop material 28$_B$ as a polish stop. Thinning of SOI film 12 is accomplished using chemical-mechanical polishing which is well known in the art. As can be seen in FIG. 9, the bottom polish stop material 28$_B$ is now self-aligned to the adjacent active device areas 32 and is included within the field region 34. The surface area of the sidewall polish stop material 28$_S$ sandwiched between the silicon region and the polysilicon region is very small compared to the silicon area and is abraded away during the chemical-mechanical polishing process. The polishing process is largely halted when the polishing pads contact the bottom polish stop material 28$_B$, the bottom polish stop material 28$_B$ providing an advantageous visual indicator of the stop point for polishing. Such a visual indicator is advantageous over prior known SOI thinning techniques which lack a visual polishing stop-point indicator. The resultant silicon film layer 12 will have a thickness equal to the thickness of the bottom polish stop material 28$_B$ which can be less than or equal to 1000Å for fully depleted CMOS. The final SOI film thickness uniformity is about ±3000Å/500 = ±6Å where 500 is the polish ratio of Si:Si$_3$N$_4$. Note that using the method according to the present invention, edge erosion, during polishing, of the silicon islands or active device regions, is avoided because the polish stop regions are completely with polysilicon. In contrast, prior techniques suffer from edge erosion of the silicon islands which results in local SOI thickness non-uniformities. Thus, the method of the present invention ensures local as well as global SOI thickness uniformities.

While the invention has been described with respect to the use of an insulative polish stop material 28, the bottom polish stop material 28$_B$ as shown in FIG. 9, may be retained for better planarity or stripped. When retained, the bottom polish stop material 28$_B$ is self-aligned advantageously according to the prescribed pattern to cover the device field region or regions. Positioning of the bottom polish stop material is determined according to the particular requirements of an integrated circuit design. The particular requirements of the integrated circuit design include the prescribed pattern of i) active device regions to be formed in the SOI film 12 and ii) desired isolation regions between the active device regions, i.e. device field isolation.

Figure 10:
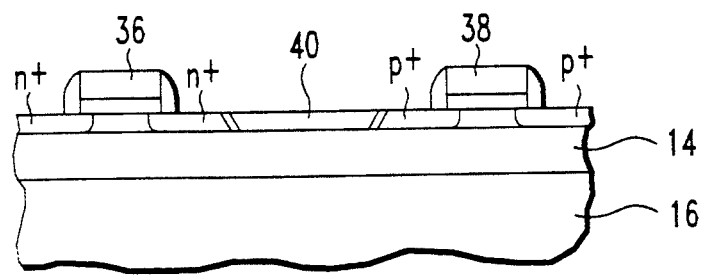
FIG. 10 shows a cross section of CMOS devices built upon the thinned SOI film.

Upon completion of the thinning of SOI film 12, the substrate 10 is now ready for subsequent fabrication of fully depleted CMOS devices using any conventional processing sequence. FIG. 10 shows a cross-section of N-BET 36 and P-FET 38 CMOS devices built upon the thinned SOI film 12, wherein isolation region 40 comprises a former polish stop.

A method of thinning SOI films to produce ultra-thin SOI films having a high degree of thickness uniformity has thus been disclosed. The method also provides for producing an ultra-thin SOI film having self-aligned isolation regions between active device regions of the thinned SOI film. Lastly, the method provides an advantageous polishing stop-point indicator.

While the invention has been particularly shown and described with reference to the preferred and alternate embodiments thereof, it will be understood by those skilled in the art that various changes in form and detail may be made therein without departing from the spirit and scope of the invention.

What is claimed is:

1. A method of thinning SOI films for providing ultra-thin active device regions having excellent thickness uniformity and further having self-aligned isolation regions between the active device regions, said method comprising the steps of:
   a) providing a substrate having an isolation layer of a first thickness formed thereon and further having a single crystal silicon layer of a second thickness formed upon the isolation layer;
   b) growing a thermal oxide layer of a third thickness upon the silicon layer, patterning the thermal oxide layer in desired regions corresponding to polish stop regions between said active device regions, and etching the patterned thermal oxide layer in the desired regions;
   c) etching the silicon layer according to the patterned thermal oxide layer with a high selectivity $Si:SiO_2$ etch on the order of 100:1 such that the insulation layer is not significantly etched, whereby grooves are created in the silicon layer;
   d) depositing a layer of insulative polish stop material upon exposed surfaces of the thermal oxide, silicon, and isolation layers, the layer of polish stop material forming top, sidewall, and bottom polish stop material thereon, respectively, partially filling the grooves and further wherein the bottom polish stop material is of a prescribed thickness corresponding to a desired thickness of the active device regions yet to be completed;
   e) depositing polysilicon upon the layer of polish stop material to further completely fill the grooves;
   f) planarizing said polysilicon layer down to the top polish stop material;
   g) etching away the top polish stop material and the oxide layer using RIE; and
   h) chemically-mechanically polishing the silicon, sidewall polish stop material, and polysilicon down to the bottom polish stop material, whereby the bottom polish stop material serves as a visual polishing stop indicator and a self-aligned isolation region to adjacent active device regions, the active device regions having uniform thickness corresponding to the thickness of the bottom polish stop material.

2. The method of claim 1, wherein the high selectivity etch of step c) comprises a wet KOH solution.

3. The method of claim 1, wherein the high selectivity etch of step c) comprises a water-ethylenediamine-pyrocatechol solution.

4. The method of claim 1, wherein the high selectivity etch of step c) comprises various mixtures of $HNO_3$—HF—$H_2O$ solution.

5. The method of claim 1, wherein the high selectivity etch of step c) comprises a highly selective dry etch.

6. The method of claim 1, wherein the layer of insulative polish stop material of step d) comprises CVD nitride.

7. The method of claim 1, wherein the layer of insulative polish stop material of step d) comprises CVD oxide.

8. The method of claim 1, wherein the active device regions of step h) have a thickness less than or equal to $1000\text{Å} \pm 100\text{Å}$.

9. A method of thinning SOI films for providing ultra-thin active device regions having excellent thickness uniformity and further having self-aligned isolation regions between the active device regions, said method comprising the steps of:
   a) providing a substrate having an isolation layer of a first thickness formed thereon and further having a single crystal silicon layer of a second thickness formed upon the isolation layer;
   b) growing a thermal oxide layer of a third thickness upon the silicon layer, patterning the thermal oxide layer in desired regions corresponding to polish stop regions between said active device regions, and etching the patterned thermal oxide layer in the desired regions;
   c) etching the silicon layer according to the patterned thermal oxide layer with a high selectivity $Si:SiO_2$ etch on the order of 100:1 such that the insulation layer is not significantly etched, whereby grooves are created in the silicon layer;
   d) growing a thin buffer oxide upon the sidewall edges of the grooves in the silicon layer;
   e) depositing a layer of insulative polish stop material upon exposed surfaces of the thermal oxide, buffer oxide, and isolation layers, the layer of polish stop material forming top, sidewall, and bottom polish stop material thereon, respectively, partially filling the grooves and further wherein the bottom polish stop material is of a prescribed thickness corresponding to a desired thickness of the active device regions yet to be completed;
   f) depositing polysilicon upon the layer of polish stop material to further completely fill the grooves;
   g) planarizing said polysilicon layer down to the top polish stop material;
   h) etching away the top polish stop material and the oxide layer using RIE; and
   i) chemically-mechanically polishing the silicon, sidewall buffer oxide, sidewall polish stop material, and polysilicon down to the bottom polish stop material, whereby the bottom polish stop material serves as a visual polishing stop indicator and a self-aligned isolation region to adjacent active device regions, the active device regions having uniform thickness corresponding to the thickness of the bottom polish stop material.

10. The method of claim 9, wherein the high selectivity etch of step c) comprises a wet KOH solution.

11. The method of claim 9, wherein the high selectivity etch of step c) comprises a water-ethylenediamine-pyrocatechol solution.

12. The method of claim 9, wherein the high selectivity etch of step c) comprises various mixtures of $HNO_3$—HF—$H_2O$ solution.

13. The method of claim 9, wherein the high selectivity etch of step c) comprises a highly selective dry etch.

14. The method of claim 9, wherein the layer of insulative polish stop material of step e) comprises CVD nitride.

15. The method of claim 9, wherein the layer of insulative polish stop material of step e) comprises CVD oxide.

16. The method of claim 9, wherein the active device regions of step i) have a thickness less than or equal to $1000\text{Å} \pm 100\text{Å}$.

* * * * *